(12) United States Patent (10) Patent No.: US 7,648,875 B2
Hong et al. (45) Date of Patent: Jan. 19, 2010

(54) METHODS FOR FORMING DRAM DEVICES INCLUDING PROTECTIVE PATTERNS AND RELATED DEVICES

(75) Inventors: Jong-Seo Hong, Gyeonggi-do (KR); Jung-Woo Seo, Gyeonggi-do (KR); Jun-Sik Hong, Gyeonggi-do (KR); Jeong-Sic Jeon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 502 days.

(21) Appl. No.: 11/327,067

(22) Filed: Jan. 6, 2006

(65) Prior Publication Data

US 2006/0146595 A1 Jul. 6, 2006

(30) Foreign Application Priority Data

Jan. 6, 2005 (KR) ............... 10-2005-0001307

(51) Int. Cl.
*H01L 21/8242* (2006.01)
(52) U.S. Cl. ............... 438/253; 438/210; 438/239; 438/396; 257/300; 257/306; 257/516; 257/532; 257/E27.084
(58) Field of Classification Search ............... 438/210, 438/239, 253, 396, FOR. 220, FOR. 430; 257/296, 300, 306, 516, 532, E27.084, E27.034
See application file for complete search history.

(56) References Cited

U.S. PATENT DOCUMENTS 6,228,762 B1 * 5/2001 Park .................. 438/639
6,239,022 B1 * 5/2001 Seo et al. ............... 438/629
6,528,368 B1 3/2003 Park
2002/0027288 A1 * 3/2002 Lee et al. ............... 257/758

FOREIGN PATENT DOCUMENTS

| JP | 2000-228502 | 8/2000 |
|---|---|---|
| KR | 1020000002008 A | 1/2000 |
| KR | 1020020058341 A | 7/2002 |
| KR | 1020020066569 A | 8/2002 |
| KR | 1020030062087 A | 7/2003 |
| KR | 1020030070701 A | 9/2003 |

* cited by examiner

*Primary Examiner*—N Drew Richards
*Assistant Examiner*—Joannie A Garcia
(74) *Attorney, Agent, or Firm*—Myers Bigel Sibley & Sajovec, P.A.

(57) ABSTRACT

A first interlayer dielectric is formed on a semiconductor substrate. A contact pad is formed to contact the substrate through the first interlayer dielectric. A bitline is formed on the first interlayer dielectric not to contact the contact pad. A second interlayer dielectric is formed and planarized to expose the top of the bitline. A protective layer is formed an entire surface of the resultant structure. A sacrificial layer is formed on the protective layer. The sacrificial layer, the protective layer, and the second interlayer dielectric are patterned between two adjacent bitlines to form a bottom electrode contact hole exposing the contact pad. A conductive layer is formed and planarized to form a bottom electrode contact plug filling the bottom electrode contact hole.

6 Claims, 16 Drawing Sheets

METHODS FOR FORMING DRAM DEVICES INCLUDING PROTECTIVE PATTERNS AND RELATED DEVICES

CROSS-REFERENCE TO RELATED APPLICATION

This application claims priority from Korean Patent Application No. 10-2005-01307, filed on Jan. 6, 2005 in the Korean Intellectual Property Office, the disclosure of which is hereby incorporated by reference herein in its entirety.

FIELD OF THE INVENTION

The present invention relates to semiconductor devices, and, more particularly, to methods for forming DRAM devices and related devices.

BACKGROUND OF THE INVENTION

Semiconductor devices, such as dynamic random access memory (DRAM) devices, may include memory cells each having one transistor and one capacitor. Since DRAM devices may not retain information stored in memory cells if power is not continuously applied, these cells may be read and refreshed at periodic intervals. DRAM devices may provide a relatively low cost per bit of memory and a relatively high device density.

As semiconductor devices continually shrink in size, DRAM devices may encounter a variety of problems, such as soft errors and/or parasitic capacitance. Further, problems may arise in the fabrication of DRAM devices. For example, a width of a lower/bottom electrode may become smaller as the integration density of semiconductor devices increases. As the width of the lower/bottom electrode becomes smaller, the lower/bottom electrode may collapse during formation. When the lower/bottom electrode collapses, the resulting shock may form cracks in structures below the lower/bottom electrode. Since a cleaning solution may penetrate through the cracks, the lower structure may be damaged, which may thereby degrade reliability of the semiconductor devices.

SUMMARY OF THE INVENTION

Exemplary embodiments of the present invention are directed to methods for forming DRAM devices and DRAM devices formed thereby. In some embodiments, the method may include forming a first interlayer dielectric on a semiconductor substrate; forming a contact pad to contact the semiconductor substrate through the first interlayer dielectric; forming a bitline on the first interlayer dielectric not to contact the contact pad; forming and planarizing an second interlayer dielectric to expose a top surface of the bitline; forming a protective layer; forming a sacrificial layer on the protective layer; patterning the sacrificial layer, the protective layer, and the second interlayer dielectric between adjacent two bitlines to form a bottom electrode contact hole exposing the contact pad; and forming and planarizing a conductive layer to form a bottom electrode contact plug filling the bottom electrode contact hole.

In other embodiments, the DRAM device may include device isolation layers disposed on a semiconductor substrate to define active regions; a first interlayer dielectric covering the semiconductor substrate; a contact pad contacting the active region through the first interlayer dielectric; bitlines disposed on the first interlayer dielectric not to contact the contact pad; a second interlayer dielectric filling the bitlines; a protective layer contacting top surfaces of the second interlayer dielectric and the bitline; and a bottom electrode contact plug contacting the contact pad through the protective layer and the second interlayer dielectric and having a taller top surface than the protective layer.

DETAILED DESCRIPTION OF EMBODIMENTS OF THE INVENTION

Figure 1:
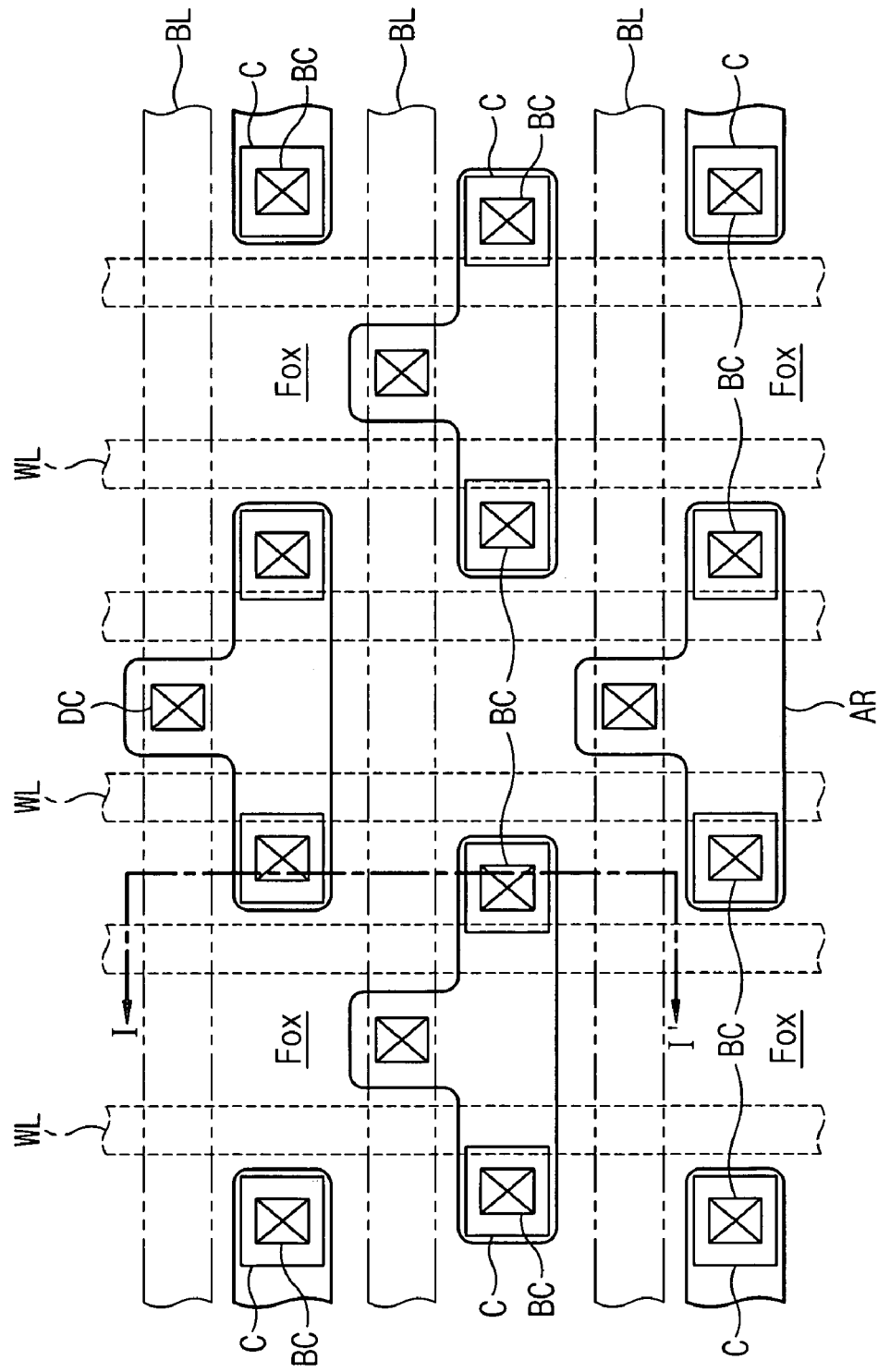
FIG. 1 illustrates a layout of a DRAM device according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention. Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

FIG. 1 illustrates a layout of a DRAM device, according to some embodiments of the present invention. FIG. 2 through FIG. 12 are cross-sectional views taken along a line I-I' of FIG. 1 illustrating methods of fabricating DRAM devices, according to some embodiments of the present invention.

Figure 2:
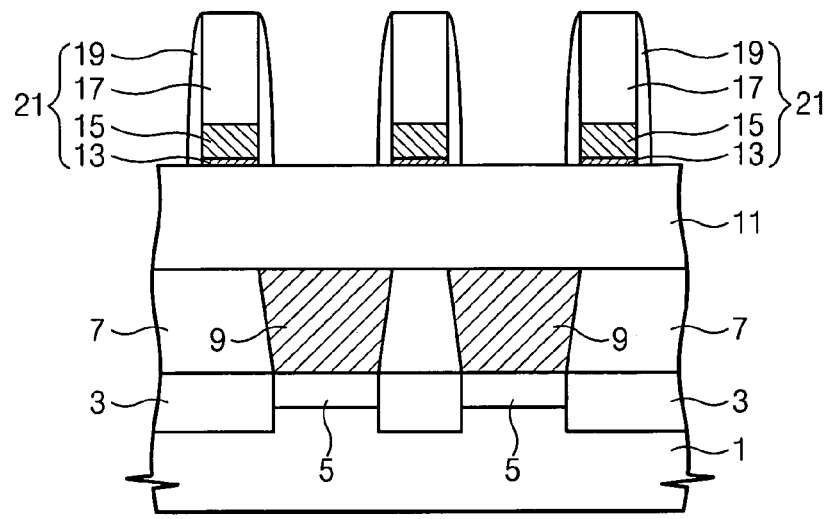
FIG. 2 through FIG. 12 are cross-sectional views taken along a line I-I' of FIG. 1 illustrating exemplary intermediate fabrication steps in methods of forming a DRAM device according to some embodiments of the present invention.

Referring to FIG. 1 and FIG. 2, device isolation layers ($F_{ox}$) 3 are formed on a semiconductor substrate 1 to define active regions AR. The formation of the device isolation layer 3 may be achieved using shallow trench isolation (STI). Although not shown in FIG. 2, a plurality of wordlines WL are formed on the substrate 1 to be parallel with one another. Each of the wordline WL may include a gate insulation layer, a gate electrode, and a capping pattern which are stacked in the order named as well as spacers covering sidewalls of the gate insulation layer, the gate electrode, and the capping pattern. Using the wordlines WL as ion implanting masks, an ion implanting process is carried out to form impurity doping areas 5 at the active regions AR. A first interlayer dielectric 7 is formed on an entire surface of a semiconductor substrate 1 where the wordlines WL are formed. The first interlayer dielectric 7 is planarized to expose a capping layer that is the top of the wordline WL. Between the wordlines, predetermined portions of the first interlayer dielectric 7 are etched to form a contact hole and a conductive layer is filled and planarized to form a contact pad (BC) 9. The formation of the BC 9 may be achieved using a self-aligned contact (SAC) process. A second interlayer dielectric 11 is formed on an entire surface of a semiconductor substrate 1 where the BC 9 is formed. A top surface of the second interlayer dielectric 11 is planarized. Between the wordlines WL, predetermined portions of the second and first interlayer dielectrics 11 and 7 are etched to form a bitline contact hole (not shown) exposing the active region, and a conductive layer is filled and planarized to form a bitline contact plug (DC). The DC is spaced apart from the BC, as illustrated in FIG. 1. A bitline (BL) 21 is formed on a semiconductor substrate 1 where the DC is formed. The bitline (BL) 21 is formed to cross over the wordline WL and to contact the DC. The formation of the bitline (BL) 21 will now be described. A barrier layer 13, a conductive interconnection layer 15, and a capping layer 17 are sequentially stacked on an entire surface of a semiconductor substrate 1 where the DC is formed. The capping layer 17, the conductive interconnection layer 15, and the barrier layer 13 are sequentially patterned to expose the second interlayer dielectric 11. A spacer 19 is formed to cover sidewalls of the patterned layers 13, 15, and 17. As a result, the bitline (BL) 21 is completed. The spacer 19 and the capping layer 17 may be made of, for example, silicon nitride.

Figure 3:
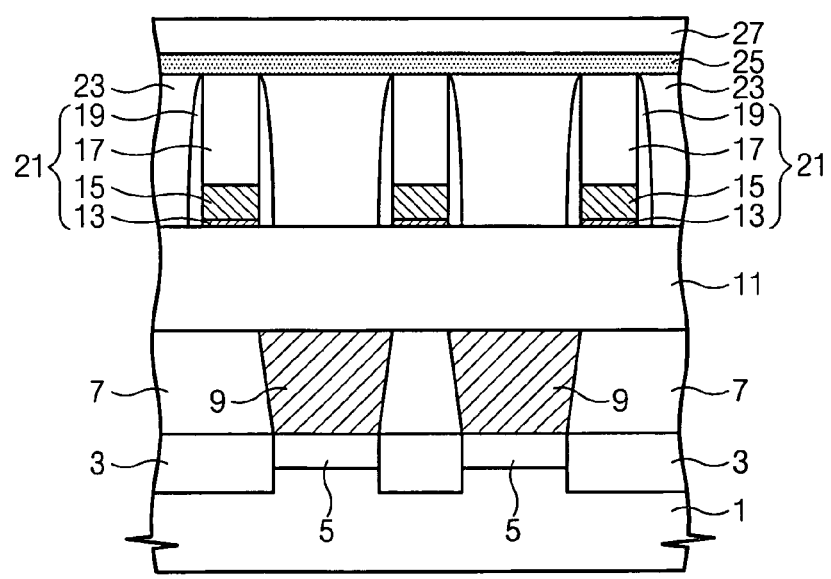

Referring to FIG. 1 and FIG. 3, a third interlayer dielectric 23 is formed on an entire surface of a semiconductor substrate 1 where the bitline (BL) 21 is formed. The third interlayer dielectric 23 is planarized to expose the capping layer 17 that is the top of the bitline (BL) 21. A protective layer 25 and a sacrificial layer 27 are sequentially formed on an entire surface of the semiconductor substrate 1. The protective layer 25 may be made of a material having an etch selectivity with respect to silicon oxide. That is, the protective layer 25 may be made of silicon oxide or silicon oxynitride. The sacrificial layer 27 may be made of, for example, silicon oxide.

Figure 4:
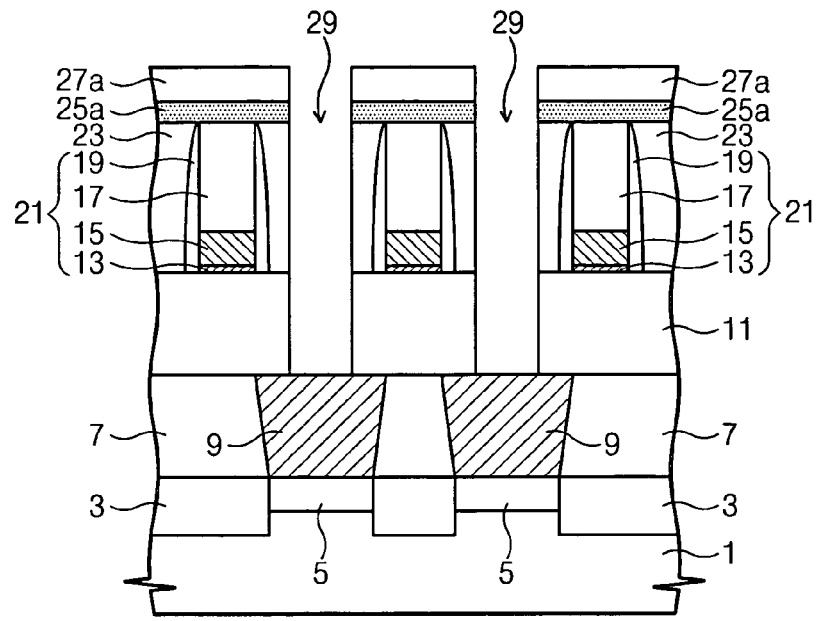

Referring to FIG. 1 and FIG. 4, using a photoresist pattern (not shown) as an etch mask, the sacrificial layer 27 and the protective layer 25 are sequentially patterned to form a sacrificial pattern 27a and a protective pattern 25a. Using the sacrificial pattern 27a and the protective pattern 25a as an etch mask, the third and second interlayer dielectrics 23 and 11 between the bitline (BL) 21 are sequentially etched to form a bottom electrode contact hole 29 exposing the contact pad (BC) 9. A conductive layer is formed to fill the bottom electrode contact hole 29 and planarized to form a bottom electrode contact plug 31.

Figure 5:
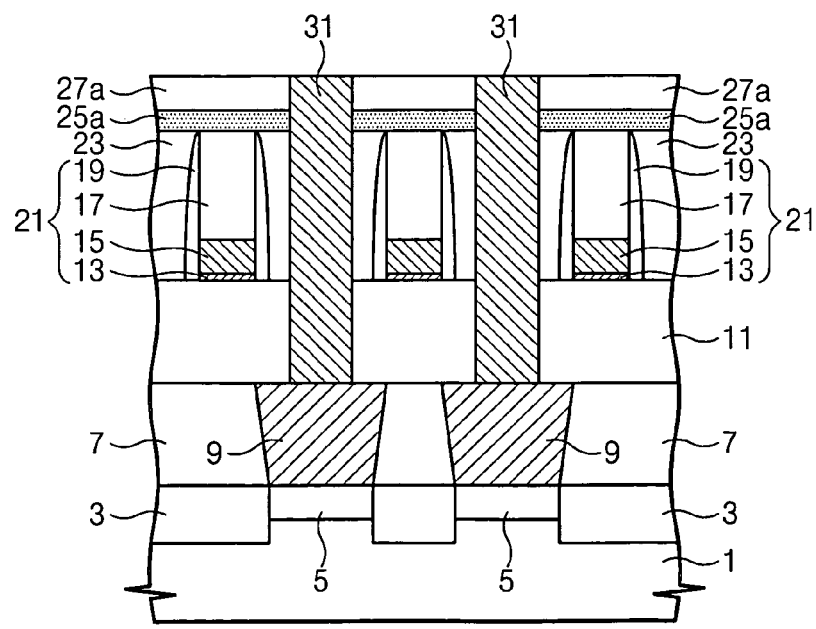

Referring to FIG. 5, the third interlayer dielectric 23 may remain to cover the sidewall of the bitline (BL) 21, constituting a sidewall of the bottom electrode contact hole 29. As a result, the spacer 19 made of silicon and the interlayer dielectric 23 are interposed between the conductive interconnection layer 15 and the bottom electrode contact plug 31. Since the third interlayer dielectric 23 generally made of an oxide-group material having a lower dielectric constant than silicon nitride, parasitic capacitance may be reduced between the bottom electrode contact plug 31 and the conductive interconnection layer 15 of the bit line 21.

An interlayer dielectric is recessed to expose a top surface of a bitline such that the interlayer dielectric remains between the bitline and a bottom electrode contact plug. A spacer is formed to cover a top side of a bitline. Using the spacer as an etch mask, the interlayer dielectric is etched to allow the interlayer dielectric to remain below the spacer. According to some embodiments of the present invention, on the other hand, using the protective pattern 25a as an etch mask, the interlayer dielectric 23 may be formed to remain at a sidewall of the bitline. Thus, a process is simplified and a process cost is reduced.

A photolithographic process is necessary to form a bottom electrode whose top surface is taller than a bitline-interposed interlayer dielectric. According to some embodiments of the present invention, on the other hand, a bottom electrode contact plug may be formed using a planarization process without a photolithographic process. Thus, a process is simplified and a process cost is reduced.

Figure 6:
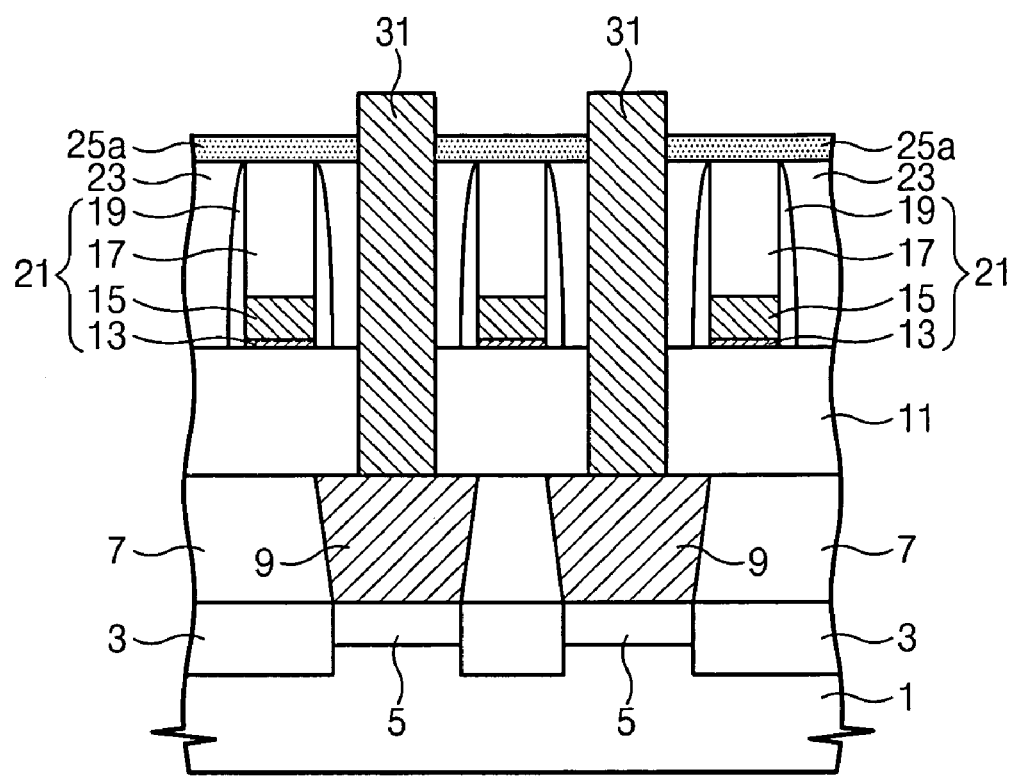

Referring to FIG. 6, the sacrificial pattern 27a is removed to expose a top surface of the protective layer 25a and a top surface of the bottom electrode contact plug 31. In a case where the sacrificial pattern 27a is made of silicon oxide, removal of the sacrificial pattern 27a may be achieved using, for example, hydrofluoric acid (HF) as an etchant.

Figure 7:
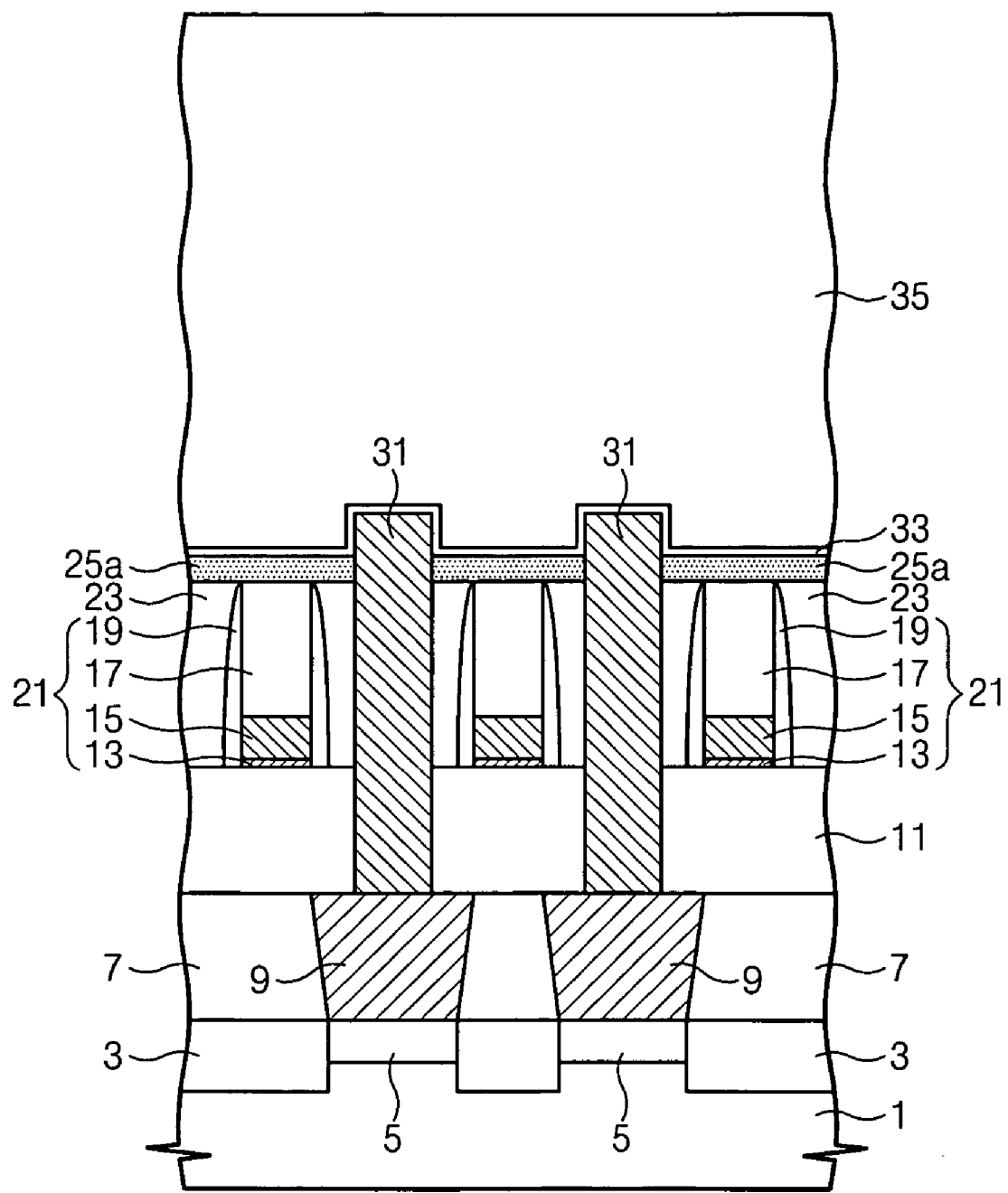

Referring to FIG. 7, an etch-stop layer 33 and a mold layer 35 are sequentially stacked on a surface of a semiconductor substrate where the sacrificial pattern 27a is removed. The etch-stop layer 33 may be made of, for example, silicon nitride. The mold layer 35 may be made of, for example, silicon oxide.

Figure 8:
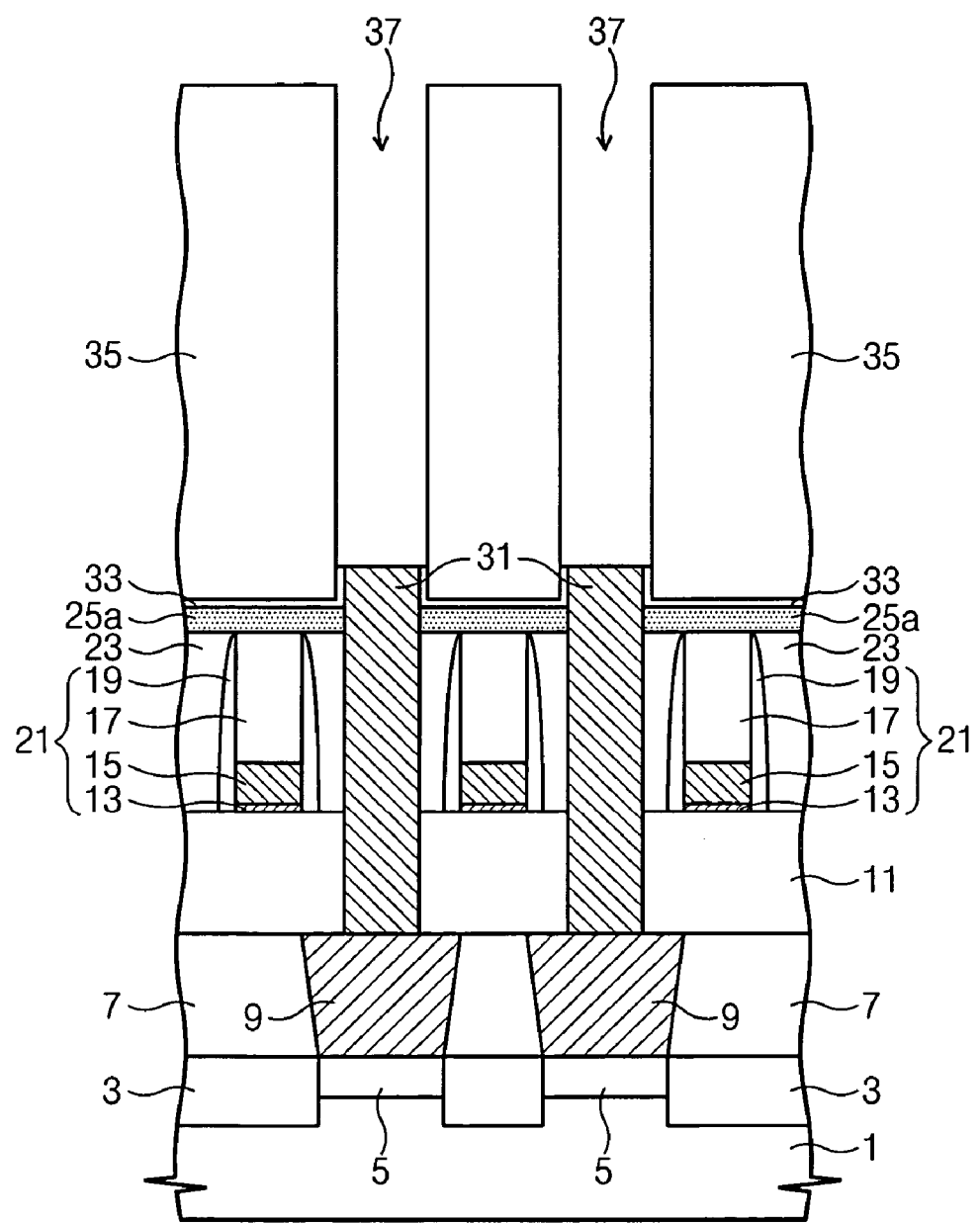

Referring to FIG. 8, the mold layer 35 is etched to form a temporary storage node hole (not shown) exposing the etch-stop layer 33 on the bottom electrode contact plug 31. The etch-stop layer 33 exposed by the temporary storage node hole is removed to form a storage node hole 37 exposing the bottom electrode contact plug 31.

Figure 9:
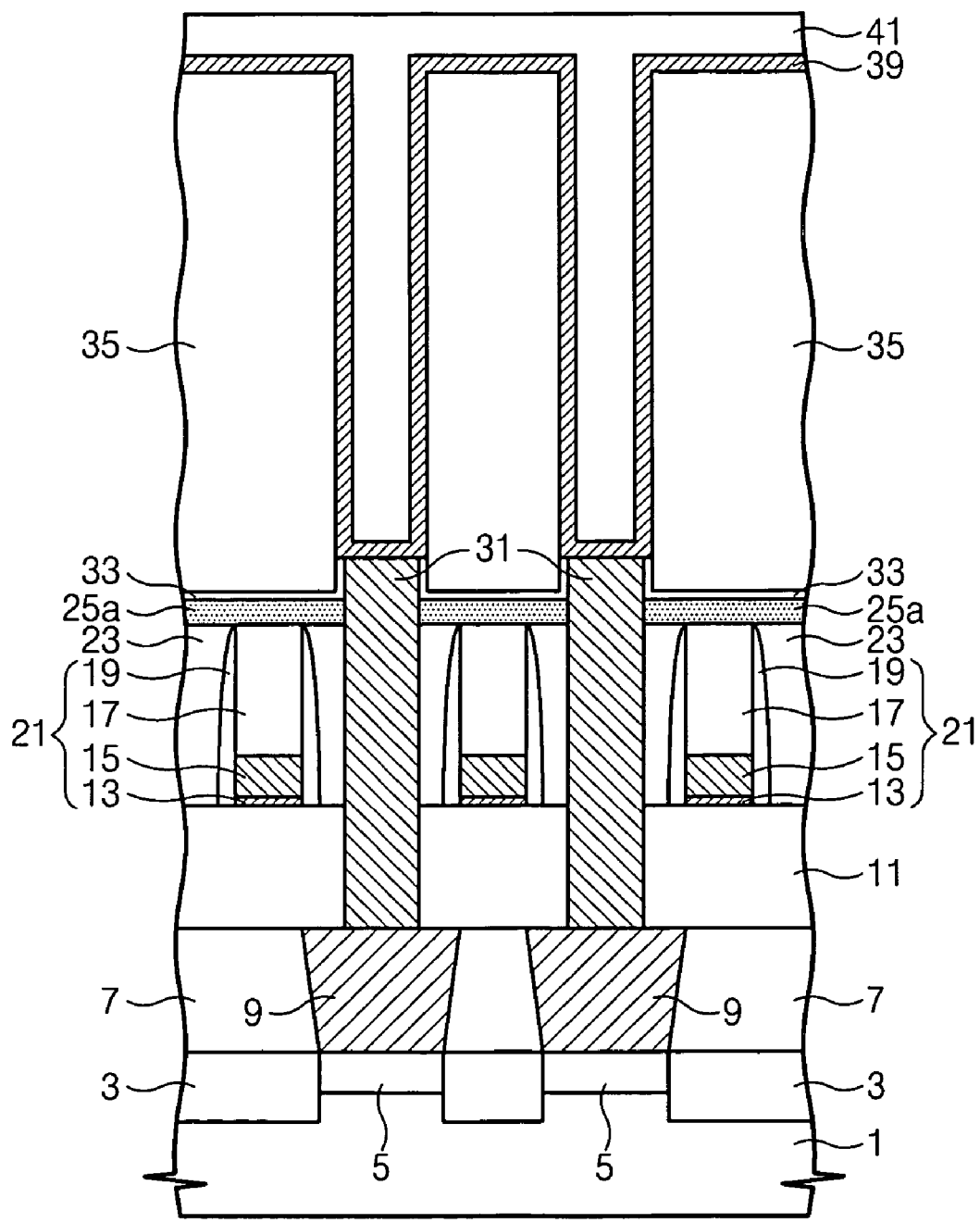

Referring to FIG. 9, a bottom electrode layer 39 is conformally formed. A sacrificial oxide layer 41 is formed to fill the storage node hole 37. The bottom electrode layer 39 may be made of doped polysilicon, titanium nitride, titanium, tantalum nitride, and/or tantalum. The sacrificial oxide layer 41 may be made of silicon oxide.

Figure 10:
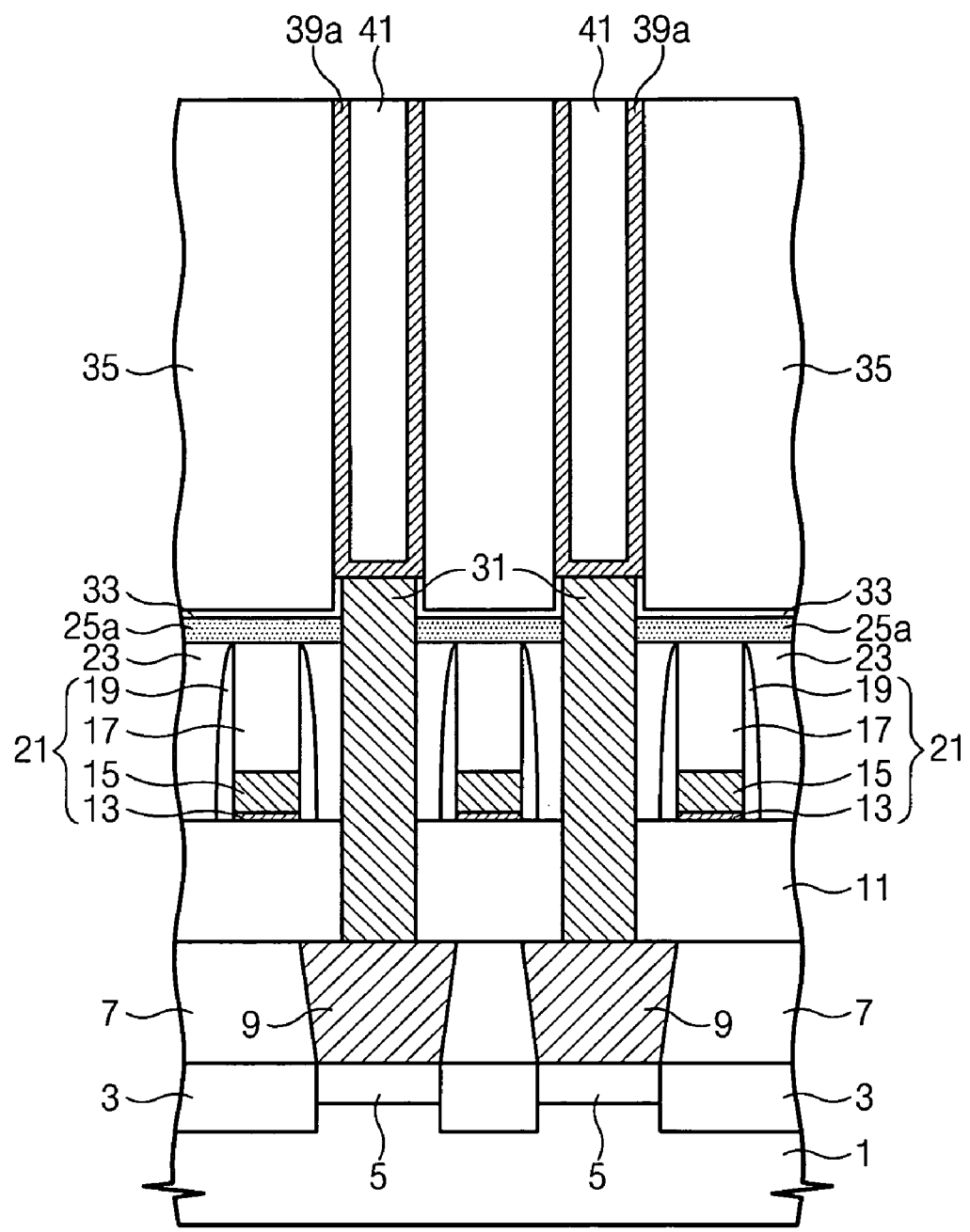

Referring to FIG. 1 and FIG. 10, the sacrificial layer 41 and the bottom electrode layer 39 are planarized to expose the mold layer 35. Thus, a bottom electrode (C) 39a is formed within the storage node hole 37 and the sacrificial oxide layer 41 remains.

Figure 11:
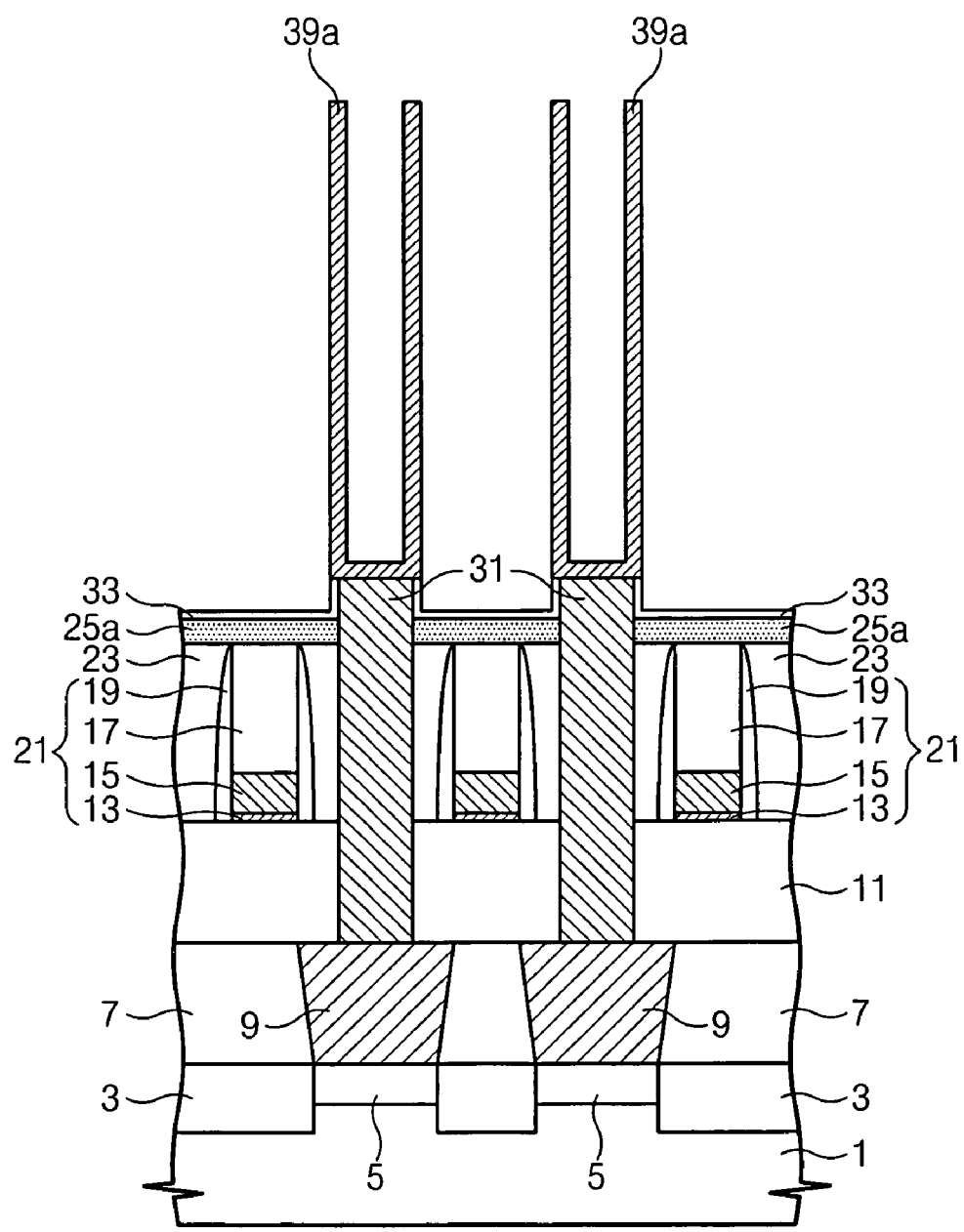

Referring to FIG. 11, the mold layer 35 and the sacrificial oxide layer 41 are removed to expose the bottom electrode 39a and the etch-stop layer 33. In a case where the mold layer 35 and the sacrificial oxide layer 41 are made of the same silicon oxide, their removal may be achieved using an etchant including HF.

When a conventional mold layer is removed, it may collapse or may be shaken because an aspect ratio of the mold layer may be relatively high. When the conventional mold layer is shaken, a physical shock may be generated to form cracks between an etch-stop layer and a bottom electrode contact plug. The etchant may penetrate through the cracks to etch the third interlayer dielectric, which may result in various problems. However, according to some embodiments of the present invention, the protective pattern 25a may reduce and/or prevent the etchant from flowing into the third interlayer dielectric, as a penetration distance of the etchant may be increased due to the protective pattern 25a and etch-stop layer 33. Thus, etching of the third interlayer dielectric may be avoided.

Figure 12:
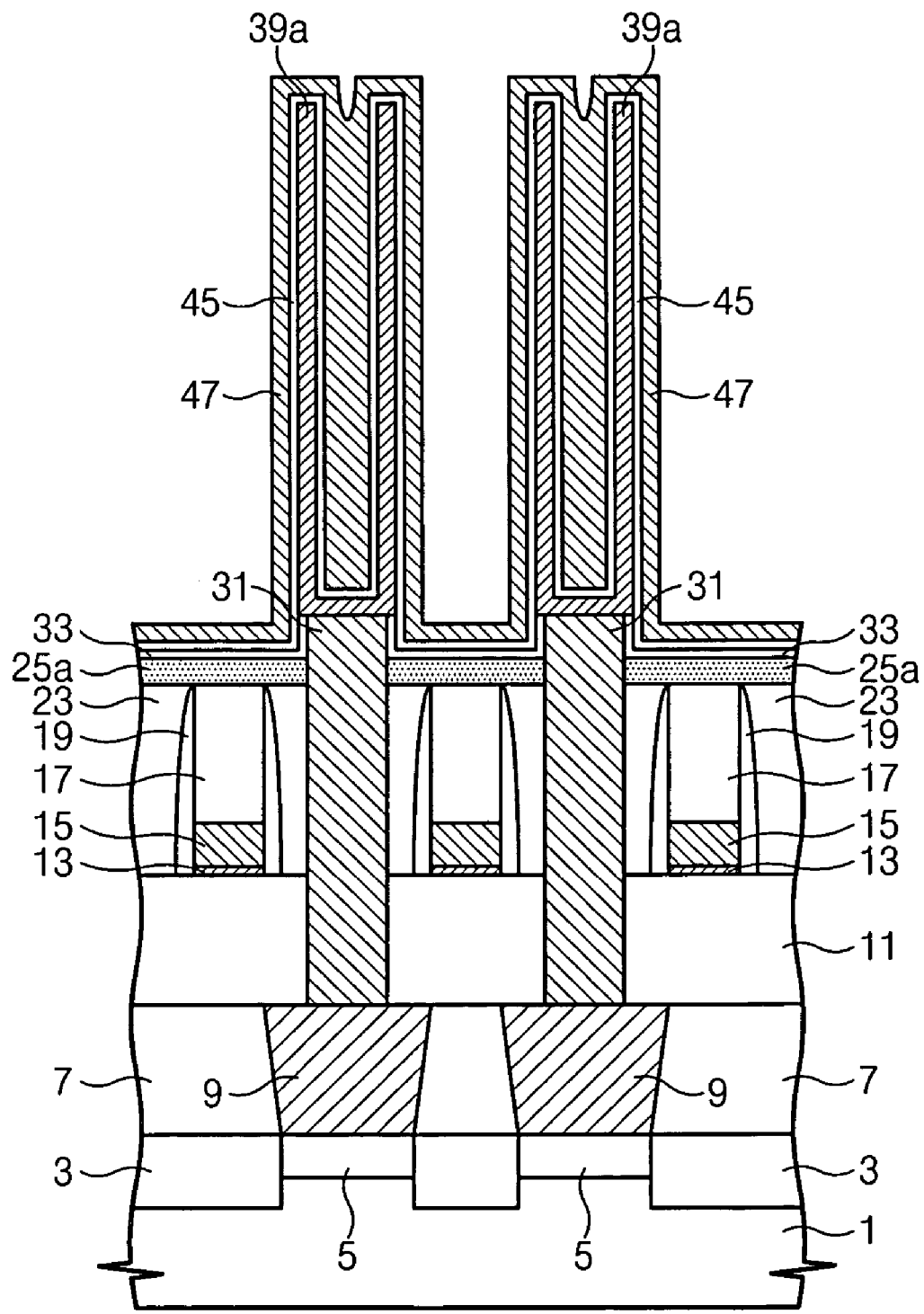

Referring to FIG. 12, a dielectric layer 45 and a top electrode layer 47 are conformally formed on an entire surface of a semiconductor substrate 1 where the bottom electrode (C) 12a and the etch-stop layer 33 are exposed. Thus, a capacitor is completed. The dielectric layer 45 is made of a high-k dielectric material and may be made of aluminum oxide, tantalum oxide, and/or hafnium oxide. The top electrode layer 47 may be made of a different material from the bottom electrode (C) 39a.

FIG. 13 through FIG. 17 are cross-sectional views taken along a line I-I' of FIG. 1 illustrating methods of fabricating DRAM devices, according to other embodiments of the present invention.

Figure 13:
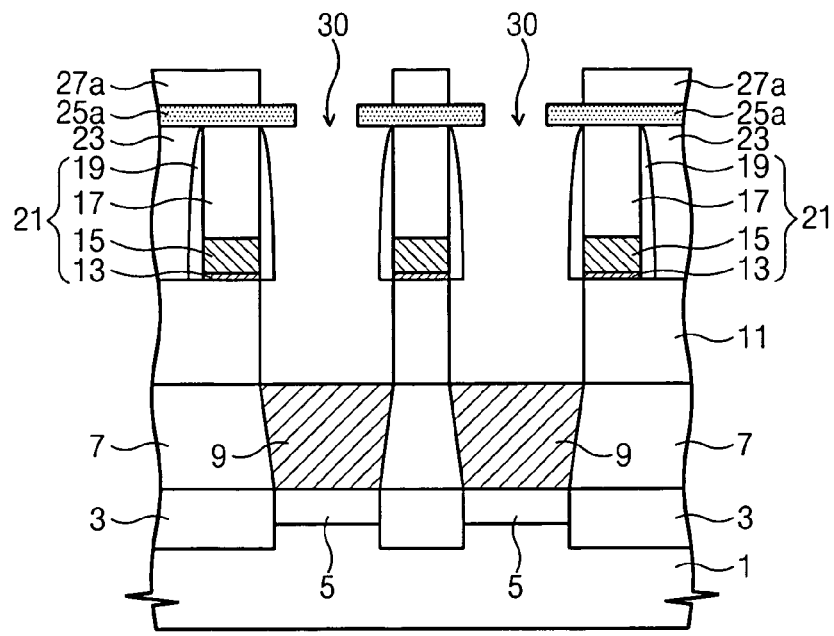
FIG. 13 through FIG. 17 are cross-sectional views taken along a line I-I' of FIG. 1 illustrating exemplary intermediate fabrication steps in methods of forming a DRAM device according to further embodiments of the present invention.

Referring to FIG. 13, after the bottom electrode contact hole 29 of FIG. 4 is formed, an isotropic wet etch is performed using an etchant including HF. Thus, the sacrificial pattern 27a, the third interlayer dielectric 23, and the second interlayer dielectric 11 are partially etched to increase a width of the bottom electrode contact hole 29. As a result, a bottom electrode contact hole 30 having a relatively large width is formed and the spacer 19 of the bitline (BL) 21 is exposed by the bottom electrode contact hole 30.

Figure 14:
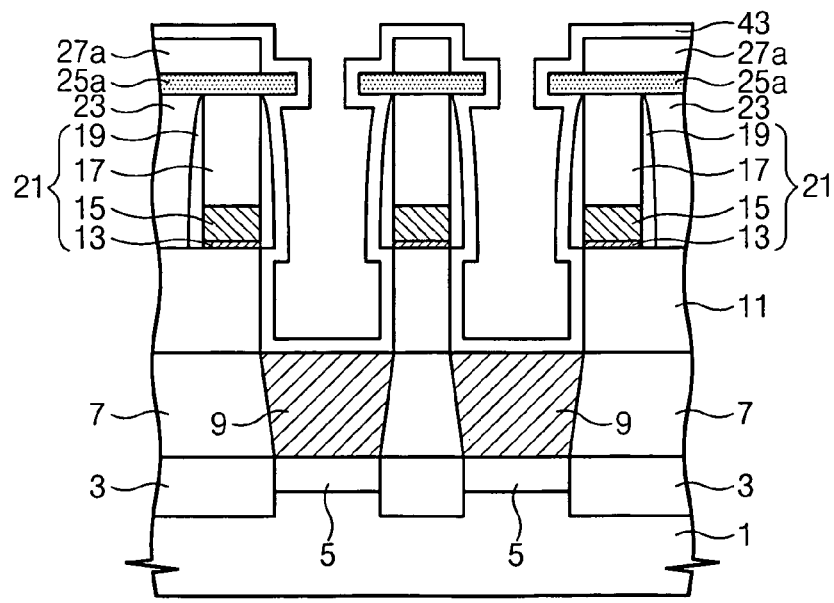

Referring to FIG. 14, an insulation spacer layer 43 is conformally formed on a surface of the semiconductor substrate 1. The formation of the insulation spacer layer 43 may be achieved using chemical vapor deposition (CVD) and/or atomic layer deposition (ALD). The insulation spacer layer 43 may be made of silicon nitride, silicon oxide, and/or silicon oxynitride.

Figure 15:
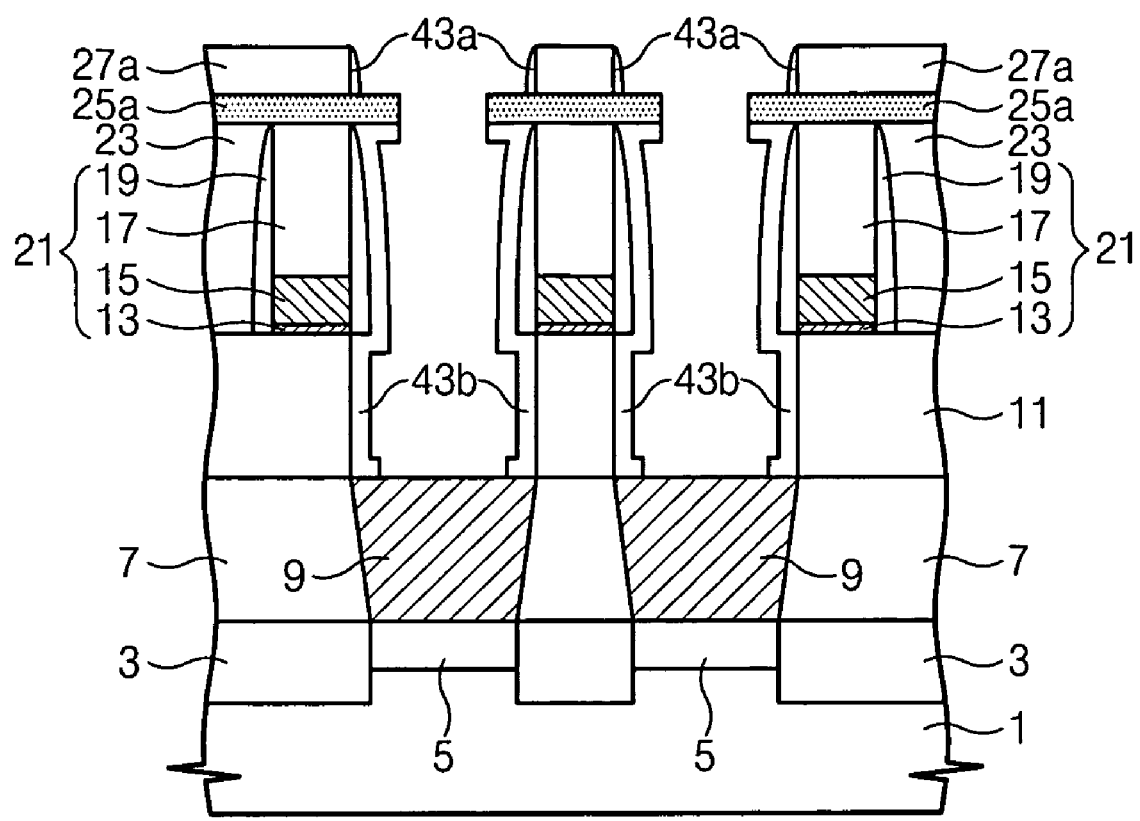

Referring to FIG. 15, the insulation spacer layer 43 is anisotropically dry etched to form a first insulation layer on a sidewall of the sacrificial pattern 27a, to form a second insulation spacer 43b on an inner sidewall of the bottom electrode contact hole 30 below the protective pattern 25a, and to expose the contact pad (BC) 9. The protective pattern 25a prevents etching of the insulation spacer layer 43 covering the inner sidewall of the bottom electrode contact hole 30 during the anisotropic dry etch, so that the second insulation spacer 43b has the same thickness as deposited initially. The insulation spacer layer 43 is formed to reduce and/or suppress parasitic capacitance between the bottom electrode contact plug 31 and the conductive interconnection layer 15. The insulation spacer 43 must have a suitable thickness in order to effectively reduce and/or suppress sacrificial capacitance. Without the protective pattern 25a, the insulation spacer layer 43 covering an inner sidewall of the bottom electrode contact hole may be etched during the anisotropic etch process. Therefore, it may be difficult to control a thickness of the insulation spacer 43. Accordingly, in some embodiments of the present invention, an initial deposition thickness of the insulation spacer layer 43 may be controlled, which may determine the thickness of the second insulation spacer 43b. Therefore, it may be possible to reduce/suppress parasitic capacitance.

Figure 16:
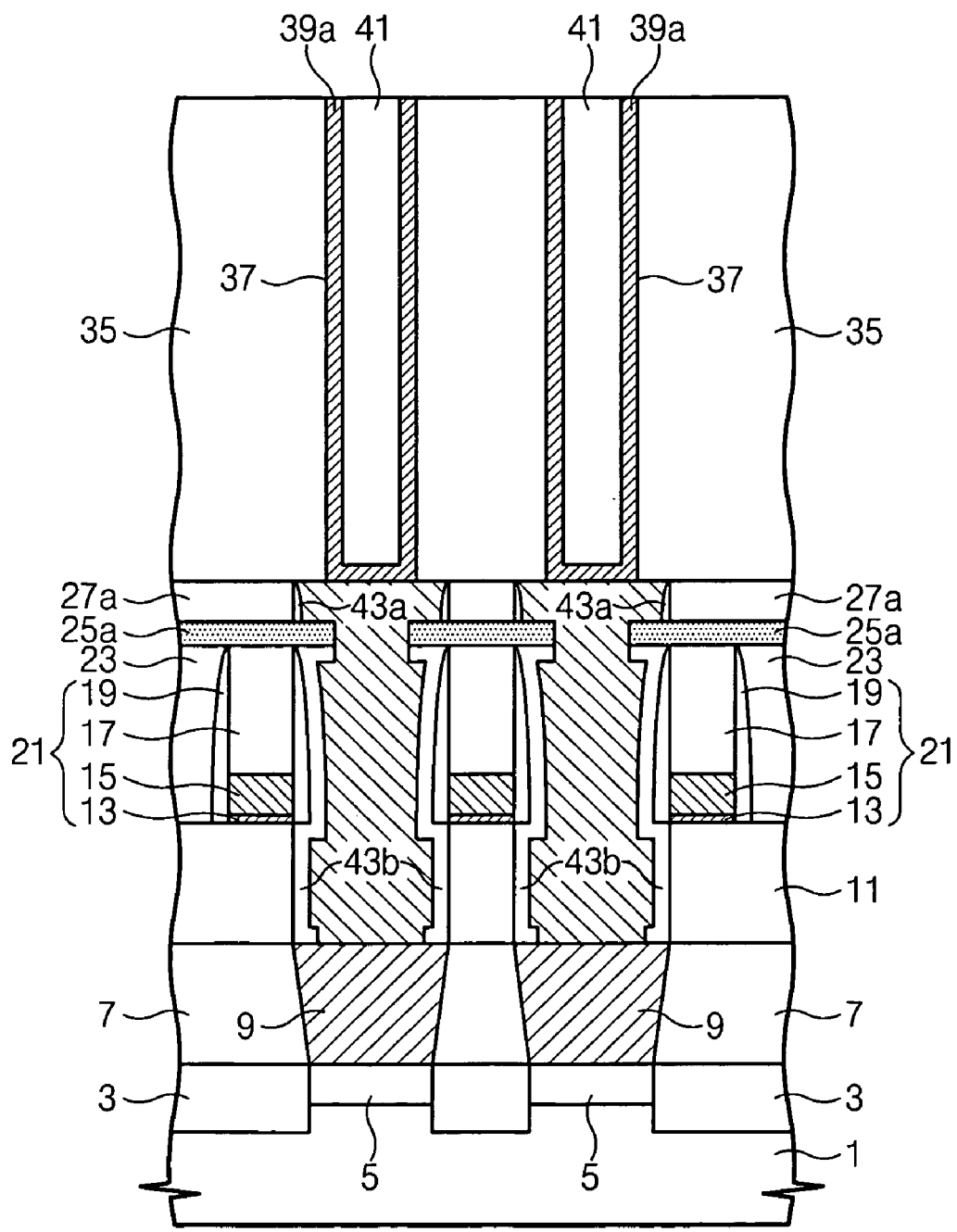

Referring to FIG. 16, a conductive layer is formed to fill the bottom electrode contact hole 30. The conductive layer is planarized to form a bottom electrode contact plug 31 within the bottom electrode contact hole 30. A mold layer 35 is stacked on the semiconductor substrate 1. The mold layer 35 is patterned to form a storage node hole exposing the bottom electrode contact plug 31. A bottom electrode layer 37 and a sacrificial oxide layer 41 are sequentially formed and planarized to expose the mold layer and to form a bottom electrode (C) 39a.

Figure 17:
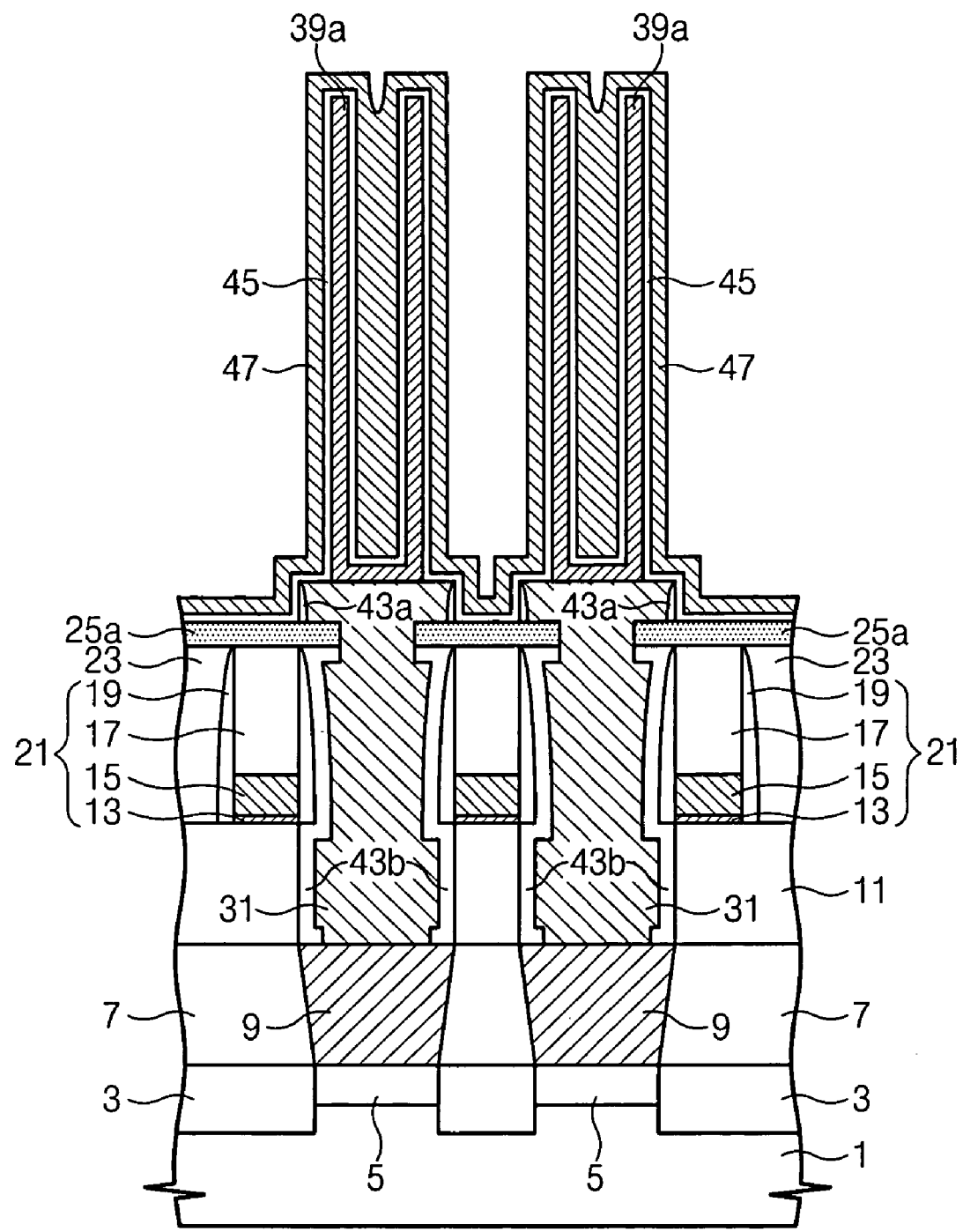

Referring to FIG. 17, the mold layer 35 and the sacrificial oxide layer 41 are removed using a cleaning solution including HF. The sacrificial pattern 27a is also removed. The protective pattern 25a and the first insulation spacer 43a may prevent the cleaning solution from penetrating the third interlayer dielectric 23 during the removal of the mold layer 35 and the sacrificial oxide layer 41. A dielectric layer 45 and a top electrode layer 47 are conformally formed to define a capacitor.

Figure 18:
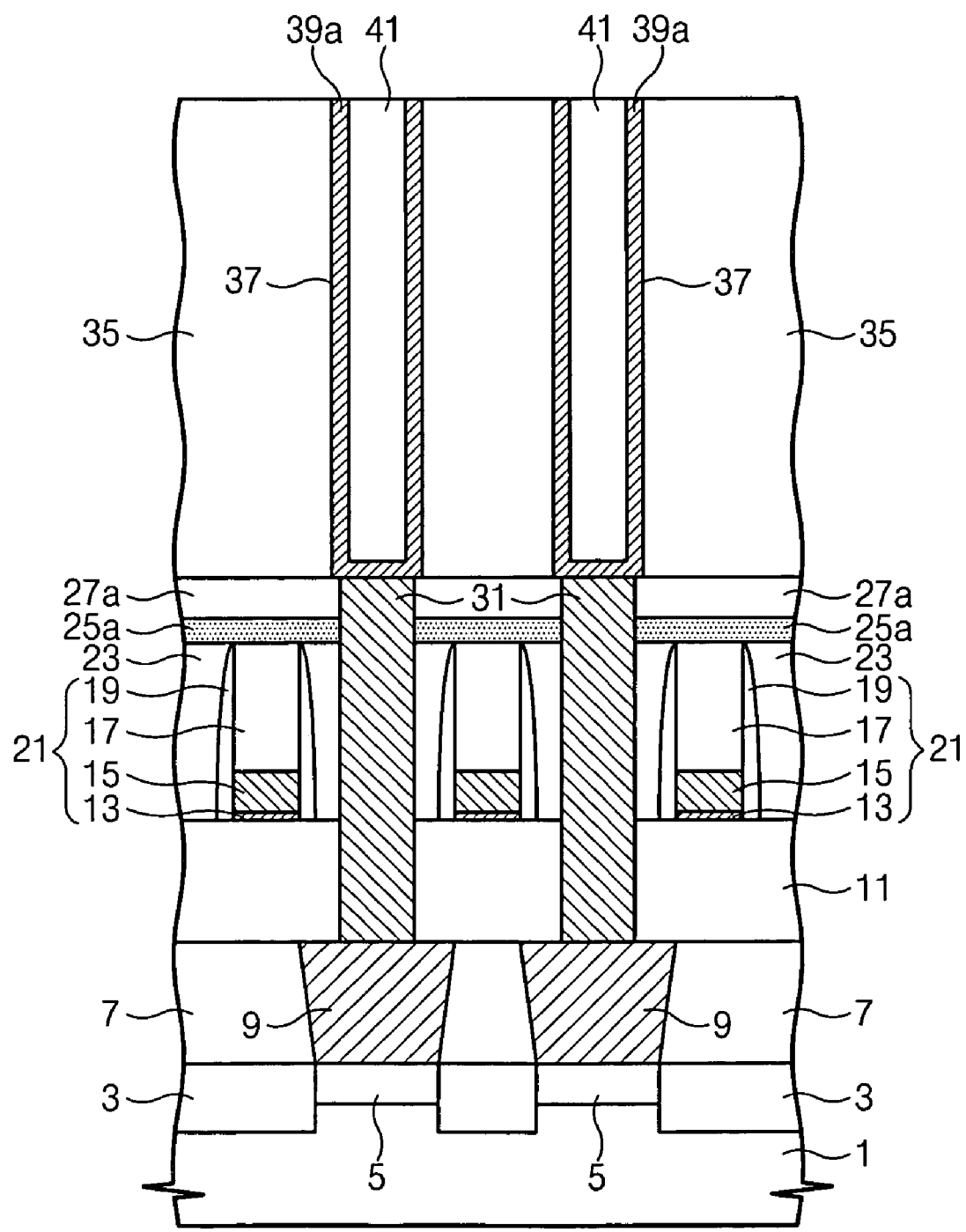
FIG. 18 and FIG. 19 are cross-sectional views taken along a line I-I' of FIG. 1 illustrating exemplary intermediate fabrication steps in methods of forming a DRAM device according to still further embodiments of the present invention.
Figure 19:
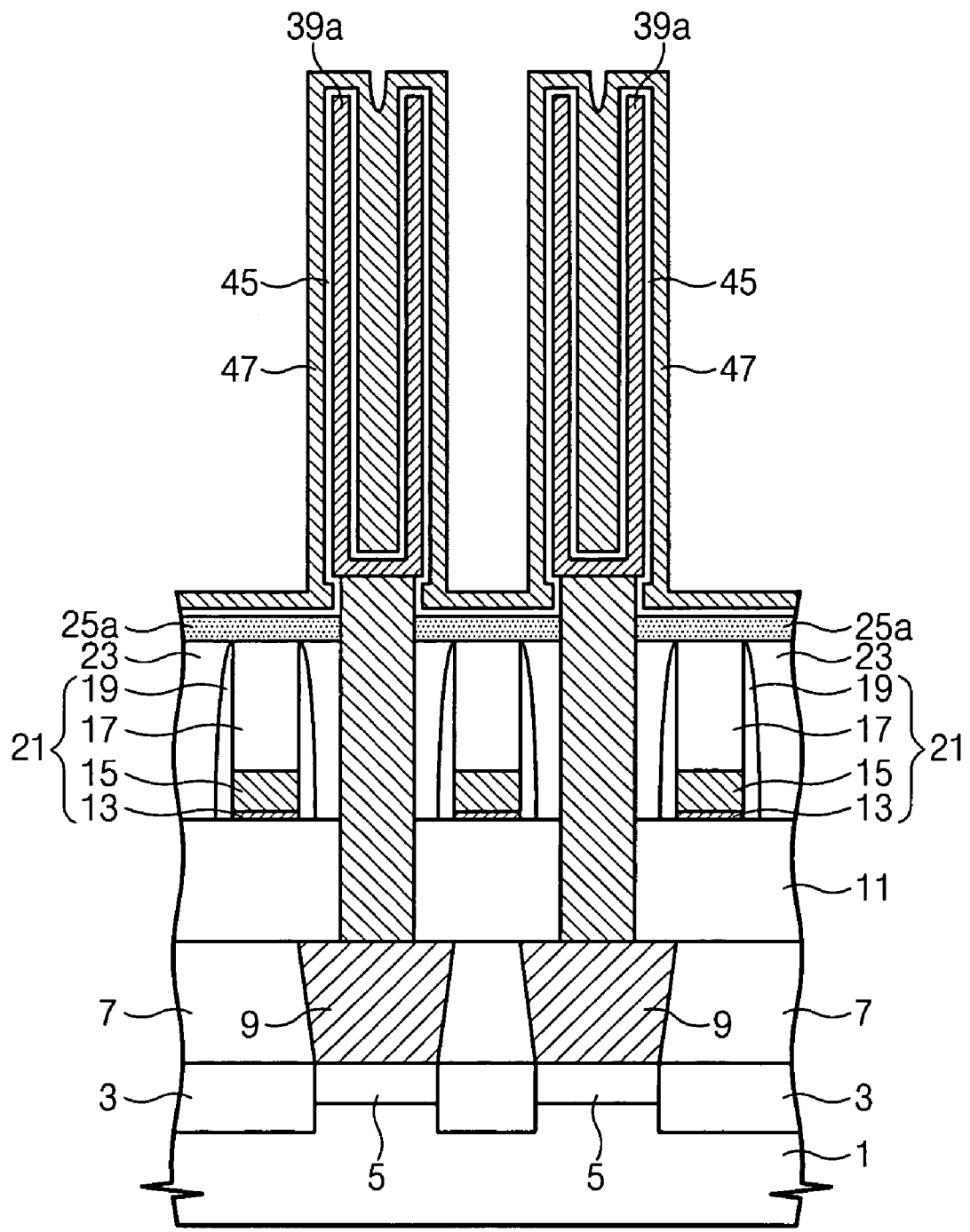

FIG. 18 and FIG. 19 are cross-sectional views taken along a line I-I' of FIG. 1 illustrating methods of fabricating DRAM devices, according to still other embodiments of the present invention.

Referring to FIG. 18, following the fabrication steps of FIG. 5, a mold layer 35 is stacked and patterned to form a storage node hole 37 exposing the bottom electrode contact plug 31. A bottom electrode layer 39 and a sacrificial oxide layer 41 are sequentially formed and planarized to expose the mold layer 35 and form a bottom electrode (C) 39a.

Referring to FIG. 19, the mold layer 35 and the sacrificial oxide layer 41 are removed using a cleaning solution including HF. The sacrificial pattern 27a is also removed to expose a top surface of the protective pattern 25a and a top side of the bottom electrode contact plug 31. The protective pattern 25a may prevent the cleaning solution from penetrating the third interlayer dielectric 23 during the removal of the mode layer 35 and the sacrificial oxide layer 41. A dielectric layer 45 and a top electrode layer 47 are conformally formed to define a capacitor. In this embodiment, the top portion of the bottom electrode contact plug 31 is covered with the dielectric layer 45 and the top electrode layer 47. As a result, a surface area of the bottom electrode may be increased as capacitance increases.

As described above, a protective pattern is formed to protect a bitline-interposed interlayer dielectric from an etchant or a cleaning solution. Thus, a reliability of a DRAM device is enhanced. Using the protective pattern as an etch mask, an interlayer dielectric or an insulation spacer is formed to remain between a bottom electrode contact plug and a bitline. Thus, a parasitic capacitance may be reduced and/or suppressed, and a device fabrication may be simplified.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A method for forming a DRAM device, comprising:
    forming a first interlayer dielectric on a semiconductor substrate;
    forming a contact pad to contact the semiconductor substrate through the first interlayer dielectric;
    forming a bitline on the first interlayer dielectric not to contact the contact pad;
    forming and planarizing a second interlayer dielectric to expose a top surface of the bitline;
    forming a protective layer above the bitline and the second interlayer dielectric layer;
    forming a sacrificial layer on the protective layer;
    patterning the sacrificial layer, the protective layer, and the second interlayer dielectric between adjacent two bitlines to form a bottom electrode contact hole exposing the contact pad;
    isotropically etching the second interlayer dielectric to increase width of the bottom electrode contact hole;
    conformally forming a spacer layer;
    anisotropically etching the spacer layer to expose the contact pad; and
    forming and planarizing a conductive layer to form a bottom electrode contact plug filling the bottom electrode contact hole,
    wherein the bitline includes a barrier pattern, a conductive interconnection, and a capping pattern which are stacked in the order named as well as spacers covering sidewalls of the barrier pattern, the conductive interconnection, and the capping pattern.

2. A method for forming a DRAM device, comprising:
    forming a first interlayer dielectric on a semiconductor substrate;
    forming a contact pad to contact the semiconductor substrate through the first interlayer dielectric;
    forming a bitline on the first interlayer dielectric not to contact the contact pad;
    forming and planarizing a second interlayer dielectric to expose a top surface of the bitline;
    forming a protective layer above the bitline and the second interlayer dielectric layer;
    forming a sacrificial layer on the protective layer;
    patterning the sacrificial layer, the protective layer, and the second interlayer dielectric between adjacent two bitlines to form a bottom electrode contact hole exposing the contact pad;
    forming and planarizing a conductive layer to form a bottom electrode contact plug filling the bottom electrode contact hole;
    forming a mold layer;
    etching the mold layer to form a storage node hole exposing the bottom electrode contact plug;
    conformally forming a bottom electrode layer;
    forming a sacrificial oxide layer to fill the storage node hole;
    planarizing the sacrificial oxide layer and the bottom electrode layer to expose the mold layer, to form a bottom electrode within the storage node hole, and to allow the sacrificial oxide layer to remain within the storage node hole;
    removing the sacrificial oxide layer and the mold layer;
    conformally forming a dielectric layer; and
    conformally forming a top electrode layer,
    wherein the bitline includes a barrier pattern, a conductive interconnection, and a capping pattern which are stacked in the order named as well as spacers covering sidewalls of the barrier pattern, the conductive interconnection, and the capping pattern.

3. The method of claim 2, wherein when the sacrificial oxide layer and the mold layer are removed, the sacrificial layer is also removed to expose the protective layer.

4. The method of claim 2, prior to formation of the mold layer, further comprising:
    conformally forming an etch-stop layer,
    wherein when the storage node hole is formed, the etch-stop layer is etched.

5. The method of claim 2, prior to formation of the mold layer, further comprising:
    removing the sacrificial layer to expose the protective layer; and conformally forming an etch-stop layer,
wherein when the storage node hole is formed, the etch-stop layer is also etched.

6. A DRAM device, comprising:

device isolation layers disposed on a semiconductor substrate to define active regions;

a first interlayer dielectric covering the semiconductor substrate;

a contact pad contacting the active region through the first interlayer dielectric;

bitlines disposed on the first interlayer dielectric not to contact the contact pad;

a second interlayer dielectric filling the bitlines;

a protective layer contacting top surfaces of the second interlayer dielectric and the bitline;

a bottom electrode contact plug contacting the contact pad through the protective layer and the second interlayer dielectric and having a taller top surface than the protective layer;

a cup-shaped bottom electrode contacting a top surface of the bottom electrode contact plug;

a dielectric layer conformally covering the bottom electrode, a sidewall of the bottom electrode contact plug, and a top surface of the protective layer;

a top electrode disposed on the dielectric layer; and an etch-stop layer interposed between the dielectric layer and the bottom electrode contact plug and between the dielectric and the protective layer below the bottom electrode, wherein the bitline includes a barrier pattern, a conductive interconnection, and a capping pattern which are stacked in the order named as well as spacers covering sidewalls of the barrier pattern, the conductive interconnection, and the capping pattern.

* * * * *